United States Patent
Li et al.

(10) Patent No.: US 10,372,036 B2
(45) Date of Patent: Aug. 6, 2019

(54) MOLD, METHOD OF PRODUCING MOLD, PRODUCTION APPARRATUS, AND METHOD OF MANUFACTURING SEMICONDUCTOR DEVICE

(71) Applicants: Kabushiki Kaisha Toshiba, Tokyo (JP); The University of Tokyo, Tokyo (JP)

(72) Inventors: Yongfang Li, Kanagawa (JP); Hiroyuki Fujita, Tokyo (JP)

(73) Assignees: Kabushiki Kaisha Toshiba, Tokyo (JP); The University of Tokyo, Tokyo (JP)

( * ) Notice: Subject to any disclaimer, the term of this patent is extended or adjusted under 35 U.S.C. 154(b) by 118 days.

(21) Appl. No.: 15/693,096

(22) Filed: Aug. 31, 2017

(65) Prior Publication Data

US 2018/0143530 A1    May 24, 2018

(30) Foreign Application Priority Data

Nov. 21, 2016    (JP) .................................. 2016-226043

(51) Int. Cl.
*G03F 7/00*    (2006.01)
*H01L 21/306*    (2006.01)

(52) U.S. Cl.
CPC .......... *G03F 7/0002* (2013.01); *G03F 7/0015* (2013.01); *H01L 21/306* (2013.01)

(58) Field of Classification Search
CPC ........................................................ G03F 7/00
See application file for complete search history.

(56) References Cited

U.S. PATENT DOCUMENTS

| | | |
|---|---|---|
| 2007/0034599 A1 | 2/2007 | Chen |
| 2009/0295364 A1 | 12/2009 | Cao et al. |
| 2015/0021191 A1 | 1/2015 | Li et al. |

FOREIGN PATENT DOCUMENTS

| | | |
|---|---|---|
| JP | 2007-73712 | 3/2007 |
| JP | 2008-47797 | 2/2008 |
| JP | 2009-505845 | 2/2009 |
| JP | 2013-219230 | 10/2013 |
| JP | 2015-23189 | 2/2015 |
| JP | 2017-130486 | 7/2017 |

*Primary Examiner* — Marvin Payen
(74) *Attorney, Agent, or Firm* — Finnegan, Henderson, Farabow, Garrett & Dunner, L.L.P.

(57) ABSTRACT

A edge electrode mold according to an embodiment includes a base having a first main surface and one or more protruding structures disposed on the first main surface. The protruding structures include a protrusion projecting from the first main surface of the base, an edge electrode disposed at the protrusion, and an electrolytic hydrophobic film having electrolytic property and hydrophobicity disposed on the upper end surface of a protruding shape including the protrusion and the edge electrode.

13 Claims, 18 Drawing Sheets

MOLD, METHOD OF PRODUCING MOLD, PRODUCTION APPARRATUS, AND METHOD OF MANUFACTURING SEMICONDUCTOR DEVICE

CROSS-REFERENCE TO RELATED APPLICATIONS

This application is based open and claims the benefit of priority from Japanese Patent Application No. 2016-226043, filed on Nov. 21, 2016; the entire contents of which are incorporated herein by reference.

FIELD

Embodiments described herein relate generally to a mold, a method of producing a mold, a production apparatus, and a method or curing a semiconductor device.

BACKGROUND

There has been an increasing demand for miniaturization and cost reduction of semiconductor devices. To increase the resolution in lithography technology, however, combinations of double patterning (DP), immersion exposure technology, extreme ultraviolet light sources, and the like are necessary and lead to cost increase. In such a situation, imprint technology that enables transfer of high-resolution patterns at low cost has been expected as next-generation lithography technology.

DETAILED DESCRIPTION

Figure 1:
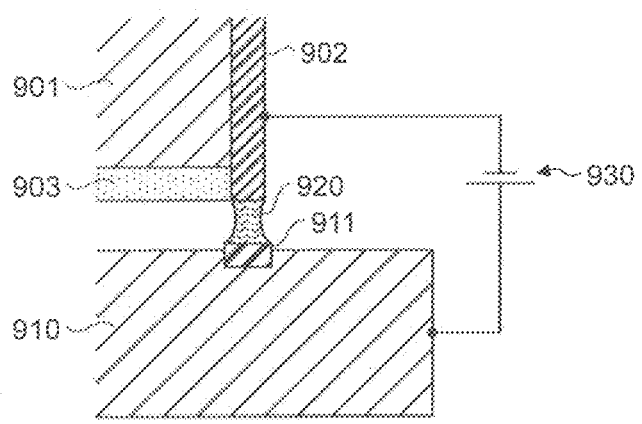
FIG. 1 is a diagram illustrating an example of the structure including a hydrophobic layer serving as a cushion on the top of a protrusion in a mold.

A mold, a method of producing a mold, a production apparatus, and a method of manufacturing a semiconductor device according to illustrative embodiments will be described in detail below with reference to the drawings.

Typical scanning probe microscope (SPM) lithography using a conductive probe has an advantage of achieving high resolution but has a drawback of an extremely low throughput, Nanoimprint lithography (NIL) capable of collectively transferring minute patterns has recently drawn attention as low-cost lithography. In nano imprint lithography, however, the transfer resolution is limited to the resolution of the pattern formed on a mold serving as a template. To achieve high resolution in nanoimprint lithography, therefore, a mold having a submicron pattern formed thereon is repaired. This, however, leads to increase in template costs. The following embodiments then suppress cost increase by achieving a finer resolution that is not limited to the resolution of the pattern formed on the mold.

An example of the technique that achieves a resolution finer than the resolution of the pattern formed on the mold is imprint technology (hereinafter referred to as thin-film edge electrode lithography (TEEL) that transfers a pattern using a mold (hereinafter referred to as edge electrode mold) having sidewall electrodes for pattern transfer formed on the side surfaces of protruding structures (hereinafter referred to as protrusions).

Thin-film edge electrode lithography is technology that uses an edge electrode mold (TEEM) having ultra-thin electrode films ledge electrodes) on the sidewalls of protrusions of the insulating mold, in place of a mold used in nonoimprint lithography, to transfer a pattern corresponding to the edge electrodes onto a surface of a target by anodic oxidation. This thin-film edge electrode lithography includes a contact type and a non-contact type. In the contact-type thin-film edge electrode lithography; while the pattern portion of the edge electrodes mold (that is, the upper end surfaces of the edge electrodes) is in contact with a substrate as a target (hereinafter referred to as transfer substrate), the pattern formed with the upper end surfaces of the edge electrodes is transferred to the transfer substrate. On the other hand, in the non-contact type thin-film edge electrode lithography, the pattern is transferred to the transfer substrate while the pattern portion is in proximity to the transfer substrate. Although the contact-type thin-film edge electrode lithography will be mainly described below, the following embodiments are also applicable to the non-contact-type thin-film edge electrode lithography.

In thin-film edge electrode lithography, increasing the atmosphere humidity during transfer is desired in order to improve uniformity of the transferred pattern. Meanwhile, using a silicon mold, is effective in terms of material coat, workability, and others. Unfortunately, silicon is oxidized by oxygen in the atmosphere. Natural oxide such as SiOx formed by this oxidation is hydrophilic. When a silicon mold is used, the tip ends of the protrusions of the mold, in contact with or in proximity to the transfer substrate then become hydrophilic. In this way, when a mold having a hydrophilic portion in contact with or in proximity to the transfer substrate is used, the meniscus at the electrode portion expands, possibly leading to reduction in transfer resolution.

A possible structure that allows the pattern portion of the mold to be brought into contact with the transfer substrate uniformly while avoiding destruction of the pattern portion is as illustrated in FIG. 1, in which a hydrophobic layer (hereinafter referred to as functional layer) 903 serving as a cushion is provided on the top (also called the upper end surface) of a protrusion 901 in a mold.

Figure 2:
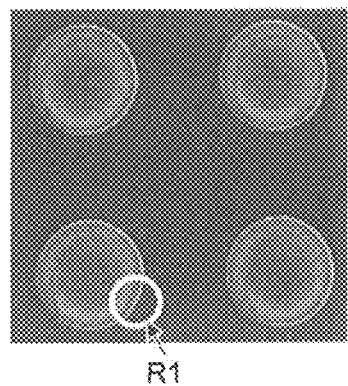
FIG. 2 is a view illustrating an example of the transfer pattern transferred using the mold illustrated in FIG. 1.
Figure 3:
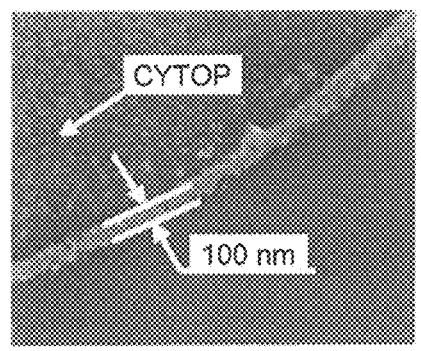
FIG. 3 is a partially enlarged view of FIG. 2.

However, as illustrated in FIG. 2 and FIG. 3, when such a functional layer 903 is provided, pressing the mold against the transfer substrate 310 may cause the functional layer 903 to partially adhere to the transfer substrate 910 and to be left in the subsequent, step, in the structure having the hydrophobic functional layer 903 on the mold side alone, the width of contact between a meniscus 920 and the transfer substrate 310 (hereinafter referred to as contact length) expands to possibly cause reduction of the transfer resolution. FIG. 2 illustrates an example of the transfer pattern transferred to a transfer substrate using the edge electrode mold illustrated in FIG. 1, and FIG. 3 is an enlarged view of a region R1 in FIG. 2.

Figure 4:
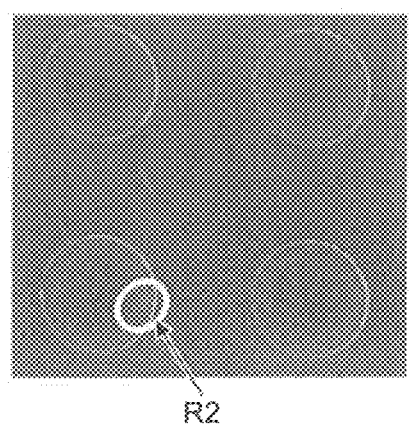
FIG. 4 is a view illustrating another example of the transfer pattern transferred to a transfer substrate using the mold illustrated in FIG. 1.
Figure 5:
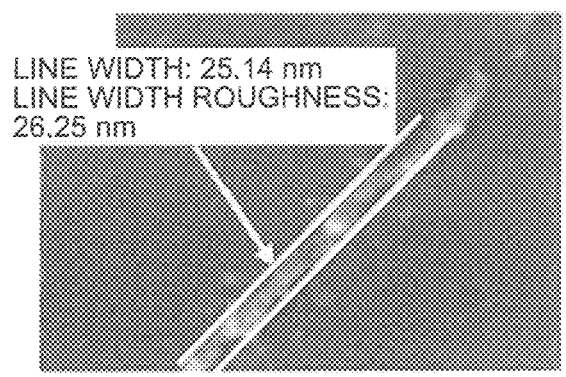
FIG. 5 is a partially enlarged view of FIG. 4.

Moreover, there is a possibility that the pattern uniformity of the edge electrodes 902 is reduced, because It is difficult to fabricate, with, high accuracy, an edge electrode mold with the functional layer 903 as illustrated in FIG. 1. As illustrated on FIG. 4 and FIG. 5, this may result in increase of the line width roughness (LWR) of the transfer pattern, which indicates the degree of roughness of the transfer pattern 911 formed on the transfer substrate 910. FIG. 4 illustrates another example of the transfer pattern transferred to a transfer substrate using the edge electrode mold illustrated in FIG. 1, and FIG. 5 is an enlarged view of a region R2 in FIG. 4.

The uniformity of a transfer pattern depends on, for example, the contact state between the mold and the transfer substrate, environment humidity, bias voltage applied, and process time. To obtain a uniform transfer pattern, it is important to uniformly form a meniscus between the transfer substrate and each individual protrusion of the mold, in particular, the edge electrode provided, on the side surface of each protrusion. A meniscus is formed at the protrusion of the mold mainly by the following two binds of phenomena; spontaneous formation and electric field induction formation.

Figure 6:
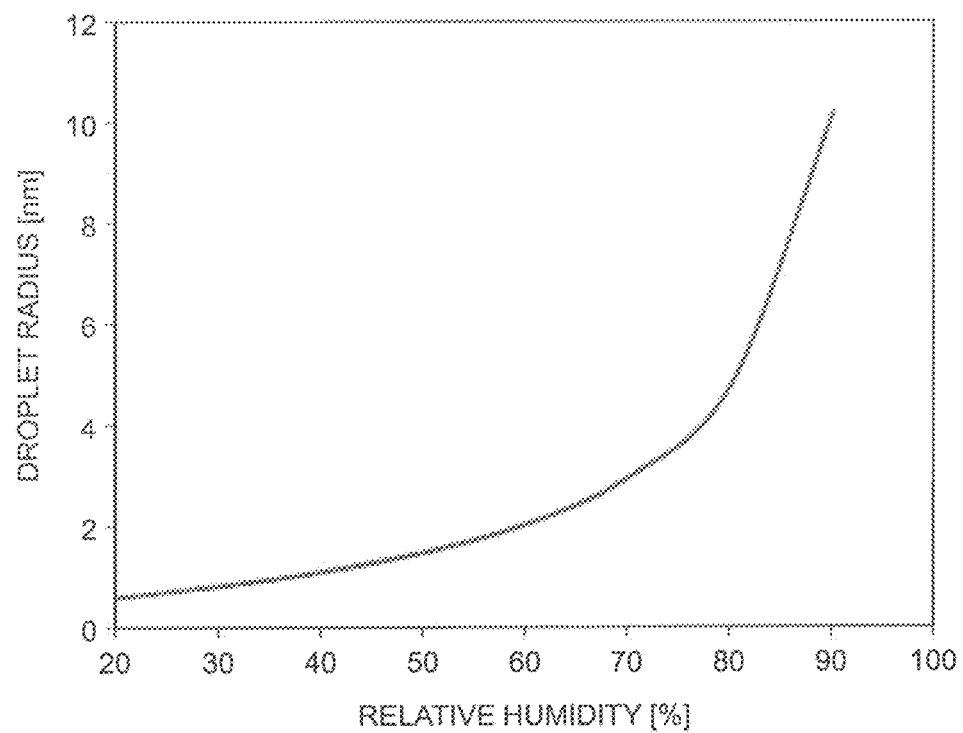
FIG. 6 is a diagram illustrating the relation between droplet radius (Kelvin radius) and relative humidity.

First, spontaneous formation will be described. Under the condition in which a meniscus is spontaneously formed both on the protrusion upper surface of the mold and on the transfer substrate surface, the radius of a water droplet formed by moisture in the atmosphere adsorbing on the surface depends on factors including relative humidity, absolute temperature, and substance surface energy. The radius of the thus formed water droplet can be obtained by the Kelvin equation expressed by Equation (1) below. FIG. 6 illustrates the relation between droplet radius also called Kelvin radius) and relative humidity.

$$r_k == \frac{2\gamma V_m}{RT\ln(RH)} \tag{1}$$

In Equation (1), RH is the relative humidity, $\gamma$ is the surface tension (N/m), Vm is the molar volume (m3/mol), rk is the droplet radius (m), R is the gas constant (J/mol/K), and T is the absolute temperature (K).

As is clear from Equation (1) above and FIG. 6, the droplet radius increases as the relative humidity RH increases. When the relative humidity RE is about 80% or higher, the droplet radius abruptly increases.

Figure 7:
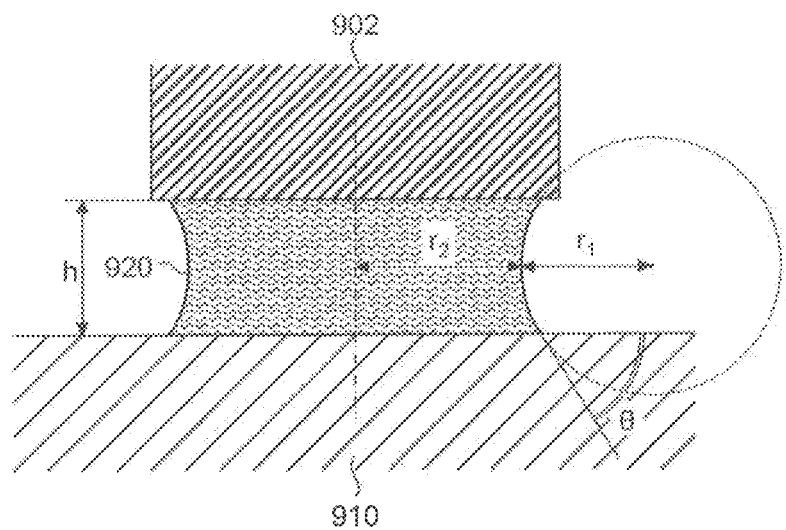
FIG. 7 is a diagram illustrating an example of the meniscus spontaneously formed between an edge electrode of the mold and the transfer substrate.

When the menisous 920 as illustrated in FIG. 7 is spontaneously formed between the edge electrode 902 of the mold and the transfer substrate 910, the relation between the pressures inside and outside of the meniscus 920 and the interface tension is expressed by Equation (2) below.

$$\Delta P = \gamma \left( \frac{1}{r_2} + \frac{1}{r_1} \right) \quad (2)$$

In equation (2), $\Delta P$ Is the pressure difference between the inside and the outside of the meniscus (Pa), $\gamma$ is the surface tension (N/m), $r_1$ is the radius of curvature of the meniscus concave/convex portion (m), and $r_2$ is the radius of curvature of the inside of the meniscus (m).

The Young-Laplace Equation written by Equation (2) can be transformed into Equation (3) below.

$$R_g T \ln(RH) = \gamma V_m \left( \frac{1}{r_2} + \frac{1}{r_1} \right) \quad (3)$$

Given Equation (3) and Equation (1) above, the relation between the droplet radius and the radius of curvature of the meniscus can be expressed by Equation (4) below.

$$\frac{1}{r_k} = \frac{1}{r_1} + \frac{1}{r_2} \quad (4)$$

Since the absolute value of the radius of curvature $r_1$ of the meniscus concave/convex portion is normally much larger than the radius of curvature $r_2$ of the inside of the meniscus ($|r_1| \ll r_2$), the relation $r_k \approx r_1$ holds, that is, the droplet radius rk is approximately equal to the radius of curvature $r_1$ of the meniscus concave/convex portion. Letting the contact angle of the meniscus be $\theta$, the height h of the meniscus can be represented by equation (5) below;

$$h = 2r_k \cos \theta \quad (5)$$

It can be derived from Equation (5) above that when the distance (the height of the meniscus) h between the edge electrode of the mold and the transfer substrate is smaller than 2rk cos $\theta$, a meniscus is spontaneously formed therebetween.

The induction formation will now be described. Even when the distance h between the edge electrode of the mole and the transfer substrate is greater than 2rk cos $\theta$ in the explanation above, a meniscus can be electrostatically inductively formed by applying between then a voltage that is equal to or greater than a threshold voltage vth necessary for meniscus formation according to Equation (6).

$$V_{th} \approx \frac{2h}{\varepsilon_0(\varepsilon - 1)} \left[ h \frac{R_g T}{V_m} \ln\left(\frac{1}{RH}\right) - 2\gamma \right] \quad (6)$$

In Equation (6), Vth is the threshold voltage necessary for meniscus formation, Rg is the gas constant, T is the absolute temperature, RH is the relative humidity, $\gamma$ is the surface tension, Vm is the molar volume, $\varepsilon 0$ is the vacuum permittivity, $\varepsilon$ is the relative permittivity of water, and h is the distance between the protrusion of the mold and the transfer substrate.

Figure 8:
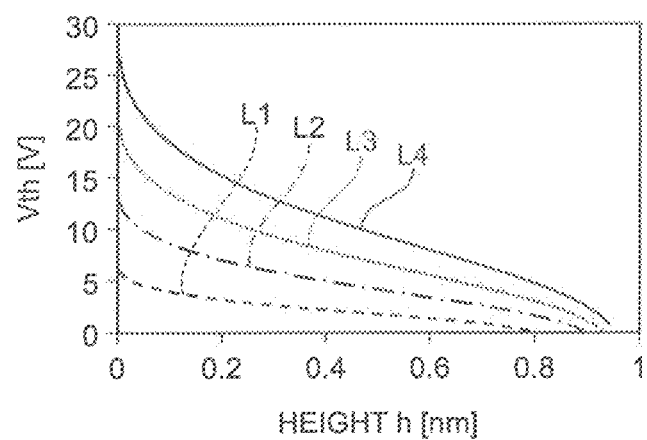
FIG. 8 is a diagram illustrating the relation between threshold voltage vth and relative humidity RH when the substrate temperature is 20° C.

As an example, the relation between the threshold voltage Vth and the relative humidity RH when the substrate temperature is 20° C. is illustrated in FIG. 8. The relation between the threshold voltage vth end the distance h when the substrate temperature is 20° C. is illustrate in FIG. 9.

In FIG. 8, the line L1 is a graph when the distance h is 5 nm, the line L2 is a graph when the distance h is 1.0 nm, the line L3 is a graph when the distance h is 15 nm, and the line L4 is a graph when the distance h is 20 nm. As is clear from FIG. 8, the higher the relative humidity RH is, the lower the threshold voltage Vth necessary for meniscus formation is. It is also understood that when the distance h between the protrusion of the mold and the transfer substrate is smaller, a meniscus is formed between the protrusion of the mold and the transfer substrate wish a lower threshold voltage Vth.

Figure 9:
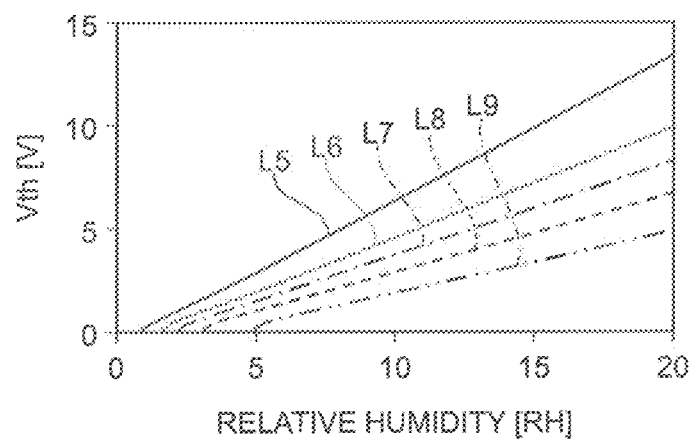
FIG. 9 is diagram illustrating the relation between threshold voltage vth and distance h when the substrate temperature is 20° C.

In FIG. 9, the line L5 is a graph when the relative humidity RH is 30%, the line L6 is a graph when the relative humidity RH is 50%, the line L7 is a graph when the relative humidity RH is 60%, the line L8 is a graph when the relative humidity RH is 70%, and the line L9 is a graph when the relative humidity RH is 80%. As is clear from FIG. 9, the greater the distance h is, the higher the threshold voltage Vth necessary for meniscus formation is. It is also understood that when the relative humidify RH is higher, a meniscus is formed between the protrusion of the mold and the transfer substrate with a lower threshold voltage Vth.

Based on the foregoing, it is understood that a meniscus can be formed between the protrusion of the mold and the transfer substrate with a relatively low bias voltage by reducing the distance h between the protrusion of the mold and the transfer substrate while keeping a relatively high relative humidity RH.

Figure 10:
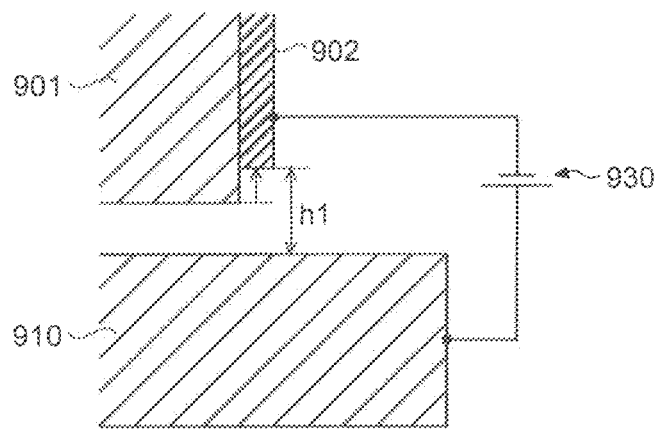
FIG. 10 is a diagram illustrating an example of the edge electrode formed on the protrusion of the mold.

However, when the pattern of the edge electrodes in the mold is non-uniform, as illustrated in FIG. 10, some of the edge electrodes 902 may be depressed relative to the protrusion 901. In such a case, the distance between the edge electrode 902 and the transfer substrate 910 is non-uniform, possibly leading to non-uniformity of the transfer pattern.

Figure 11:
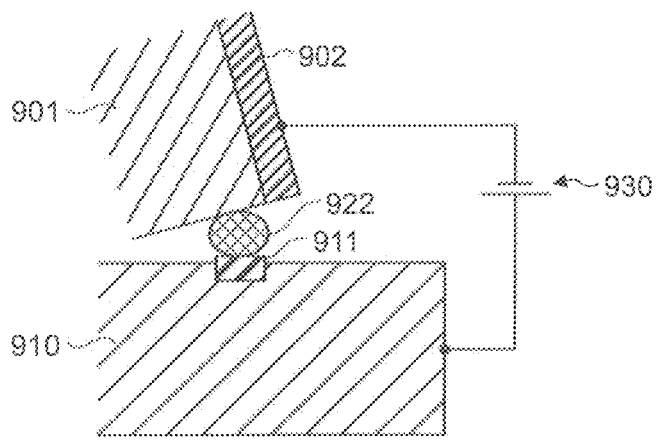
FIG. 11 is a diagram illustrating an example of the contact state between the protrusion of the mold and the transfer substrate.

As illustrated in FIG. 11, for example, when an undesired substance 922 such as dust adheres to the surface of the transfer substrate 910, the undesired substance 922 sandwiched between the protrusion 901 of the mold and the transfer substrate 910 makes the contact state therebetween non-uniform, possibly leading to non-uniformity of the transfer pattern 911.

Figure 12:
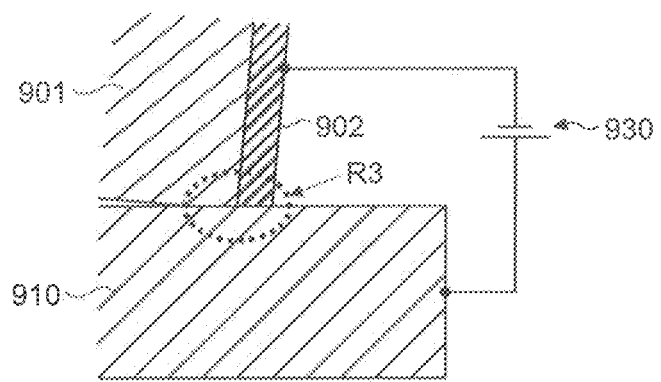
FIG. 12 is a diagram illustrating another example of the contact state between the protrusion of the mold and the transfer substrate.
Figure 13:
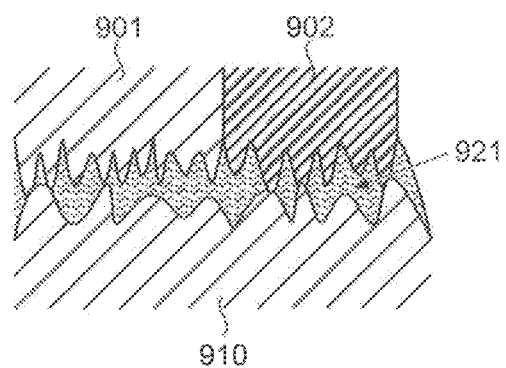
FIG. 13 is a partially enlarged view of FIG. 12.

The protrusion surface of the mold and the surface of the transfer substrate each have surface roughness to a certain degree. Therefore, as illustrated in FIG. 12 and FIG. 13, the contact between the protrusion 901 of the mold and the transfer substrate 910 is actually considered as the contact between non-uniform surfaces. In such a case, water 921 penetrates into between the protrusion 901 and the transfer substrate 910 due to capillarity, possibly resulting in reduction in uniformity of the transfer pattern and transfer resolution. FIG. 12 is a diagram illustrating another example of the contact state between the protrusion of the mold and the transfer substrate, and FIG. 13 is an enlarged view of the region R3 in FIG. 12.

The rate of production of an oxide film serving as a transfer pattern is proportional to the intensity of electric field formed between the edge electrode of the mold and the transfer substrate. Here, the electric field intensity differs between the location actually in contact and the location at a distance. The rate of production of the oxide film thus also differs between the location actually in contract and the location at a distance. That is, the rate of production of the oxide film at the location where the distance between the edge electrode and the transfer substrate is relatively small is higher than at the location where the distance is relatively large. As a result, when the transfer time is relatively short, the location at a distance is reacted insufficiently, thereby reducing the uniformity of the transfer pattern. On the other hand, when the transfer time is sufficiently long, the reaction proceeds up to the contact length between the meniscus and the transfer substrate even at the location where the distance between the edge electrode and the transfer substrate is relatively large. In this case, the uniformity of the pattern is improved, but the transfer resolution may be deteriorated.

As described above, the transfer resolution in thin-film edge electrode lithography mainly depends on parameters such as the contact length between the meniscus and the transfer substrate, bias voltage, relative humidity, and transfer time. Reducing these parameters may be effective to achieve a high transfer resolution, whereas increasing bias voltage, relative humidity, and transfer time is desired to achieve transfer uniformity. In addition, to reduce the roughness of the transfer pattern, an edge electrode mold produced with high accuracy is also necessary.

In the following embodiments, a mold that can reduce the roughness of the transfer pattern while improving transfer resolution and transfer uniformity in thin-film edge electrode lithography, a method of producing a mold, a production apparatus, and a method of manufacturing a semiconductor device will be described with examples. The following description mainly illustrates embodiments that improve at least one of three items below to reduce the roughness of the transfer pattern while improving transfer resolution and transfer uniformity in thin-film edge electrode lithography. The following embodiments are merely illustrative and not intended to limit the scope of the present invention.

Figure 14:
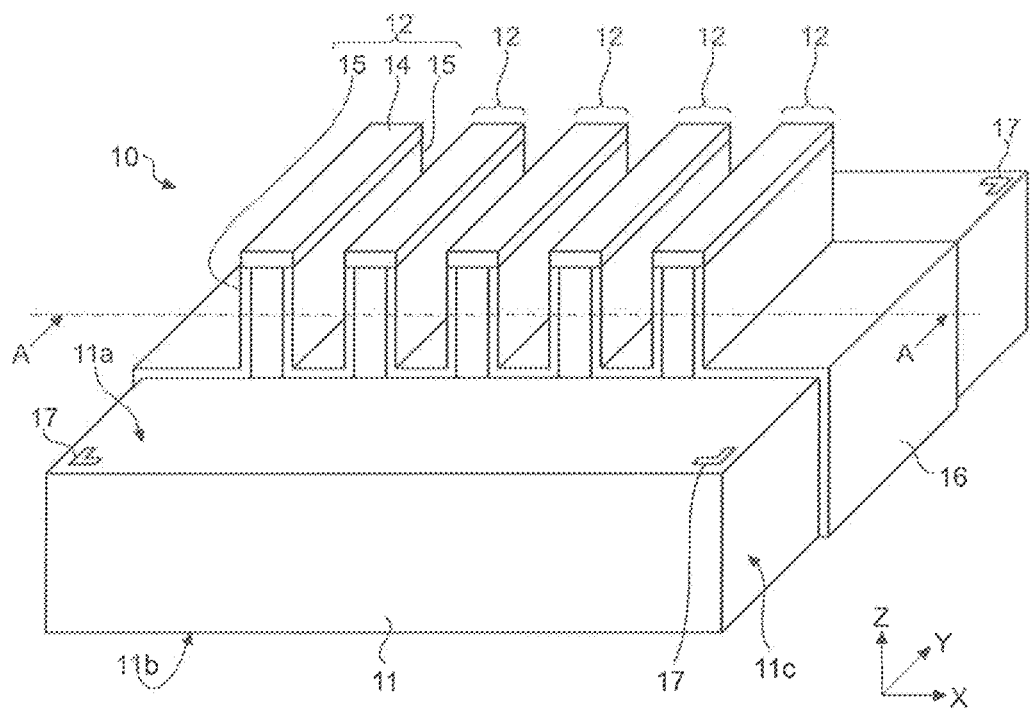
FIG. 14 is a perspective view illustrating a schematic configuration example of the edge electrode mold according to a first embodiment.
Figure 15:
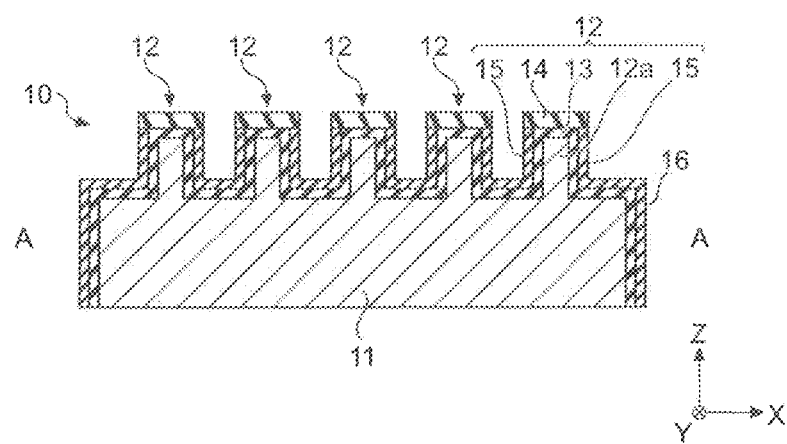
FIG. 15 is a cross-sectional view illustrating a schematic configuration example of the edge electrode mold in FIG. 14 taken along A-A.

(1) Control of size of the meniscus, in particular, the contact length from the transfer target (2) Improvement of contact uniformity (3) Higher accuracy and lower roughness of the mold First Embodiment FIG. 14 is a perspective view illustrating a schematic configuration example of an edge electrode mold according to a first embodiment. FIG. 15 is a cross-sectional view illustrating a schematic configuration example of the edge electrode mold in FIG. 14 taken along A-A. In the description of FIG. 14 and FIG. 15, the XY plane is a horizontal plane, and the Z direction is the height direction.

As illustrated in FIG. 14 and FIG. 15, an edge electrode mold 10 includes a base 11, a plurality of protruding structures 12, and an extraction electrode 16.

The base 11 is a member serving as a base for the edge electrode mold 10. For example, an insulating material such as silicon and quartz can be used for the base 11. Alternatively, an insulating resin such as polydimethylsiloxane (PDMS) and paraxylene may be used as the material of the base 11. The base 11 may be formed of an insulating material having optical transmittance.

Each of a plurality of protruding structures 12 is a mesa-shaped structure provided on a first main surface (which may be referred to as an upper surface) 11a of the base 11. FIG. 14 illustrates a structure in which a plurality of protruding structures 12, each extending in the Y direction on the first main surface 11a of the base 11, are arranged to be spaced apart from each other at a predetermined distance in the X direction. The structure is not limited to the one illustrated in FIG. 14 and is susceptible to various modifications depending on the layout of the pattern to be transferred. For example, the gap between adjacent protruding structures 12 may be filled with a hydrophobic insulating material to fill in the gap between the adjacent protruding structures 12.

Each protruding structure 12 includes a protrusion 12a, an insulating film 13, one or more (two in the first embodiment) edge electrodes (first electrode) 15, and an electrolytic hydrophobic film 14.

The protrusion 12a is a mesa-shaped structure projecting from the first main surface 11a of the base 11 and is formed of an insulating material such as silicon, quarter, and resin. This protrusion 12a may be a structure cut from a bulk base material (for example, substrate) from which the base 11 is formed, or may be a structure joined to or grown on the base 11. The protrusion 12a may have a tapered shape in view of easiness in the film deposition process in the production step described later.

The insulating film 13 is provided between the edge electrode 15 and the base 11 and on the upper end surface of the protrusion 12a in order to reduce the electrical connection between the edge electrode 15 and the base 11 and the electrical connection between the protrusion 12a and the transfer substrate as a transfer target when they are in contact with each other. For the insulating film 13, a variety of insulating films may be used, for example, including an oxide film formed on the entire surface of the base 11 and the protrusion 12a, and an insulating resin coated on the entire surface of the base 11 and the protrusion 12a.

The edge electrodes 15 are a structure for transferring a pattern to the transfer substrate, and their upper end surfaces form a pattern portion as described above. The edge electrodes 15 are formed of, for example, a conductive material such as conductive metals and conductive metal oxides. Examples of the conductive material that may be used include, but not limited to, Ru, Pt, Rh, W, Ni, Au, Ir, RuO, and IrOx.

Each edge electrode 15 is provided on the side surface of the protrusion 12a covered with the insulating film 13 such that its upper end surface is substantially flush with the upper surface of the insulating film 13 formed on the protrusion 12a. In other words, the edge electrode 15 is provided in a position to form a sidewall of the protruding structure 12. In the first embodiment, the edge electrode 15 is provided on each of the opposed two side surfaces of the side surfaces of the protruding structure including the protrusion 12a and the insulating film 13. Such a configuration can achieve a fine pattern having a pitch substantially half the pitch of the protrusion 12a.

The upper end surfaces of a plurality of edge electrodes 15 form a pattern portion to be transferred to the transfer substrate as described above. It is therefore possible to adjust the width of the pattern transferred to the transfer substrate by adjusting the width (equivalent to the thickness of the edge electrode 15) of the upper end surface of each edge electrode 15. The width of the upper end surface of the edge electrode 15, for example, is smaller than the width of the upper end surface of the protrusion 12a and may be a few times or a few tens of times smaller than the width of the upper end surface of the protrusion 12a. As a specific example, the width may be about a few nanometers to a few hundred nanometers.

The extraction electrode 16 is formed, for example, from a region where the protruding structure 12 is not formed in the first main surface 11a of the base 11 to the side surface 11c or the back surface (the second main surface 11b opposite to the first main surface 11a) of the base 11. This extraction electrode 16 is an electrode for electrically extracting a plurality of edge electrodes 15 and is connected to an external electrode for current input during pattern transfer to form an electrical contact. For example, metal such as Al, Cu, W, and Au may be used for the material of the extraction electrode 16. The material is not limited to these examples and a variety of conductive materials may be used.

An alignment mark 17 for position adjustment may be provided on the base 11. This alignment mark 17 can be used for position adjustment during production of the edge electrode mold 10 or during pattern transfer.

The electrolytic hydrophobic film 14 is provided to cover at least the upper end surface of the protruding structure including the protrusion 12a, the insulating film 13, and the edge electrode 15. The electrolytic hydrophobic film 14 is not limited to this configuration and may be provided, for example, to cover the entire upper surface 11a of the base 11 provided with the protrusions 12a, the insulating film 13, and the edge electrodes 15.

The electrolytic hydrophobic film 14 is a film for controlling the presence range of the meniscus during pattern transfer, and can be electrolyzed (hereinafter referred to as "having electrolytic property") and has hydrophobicity. The electrolytic hydrophobic film 14 is locally removed by applying bias voltage during pattern transfer. As a result, the upper end surface of the edge electrode 15 is exposed.

The hydrophobicity required for the electrolytic hydrophobic film 14 may be, for example, such that the contact angle to water is 45° or more. The hydrophobicity, however, is not limited to the above and is modified as desired as long as the expansion of the meniscus formed between the edge electrode mold 10 and the transfer substrate can be controlled. For example, the hydrophobicity of the material that forms the electrolytic hydrophobic film 14 is any hydrophobicity higher than the hydrophobicity of the material that forms the protrusion 12a or the insulating film 13.

A variety of materials that can be electrolyzed and have hydrophobicity, such as organic silanes such as hexamethyldisilazane (HMDS), can be used as the material of the electrolytic hydrophobic film 14 that can be electrolyzed and has hydrophobicity. Hexamethyldisilazane is thought to be one of effective materials because its affinity is relatively high for silicon oxide (SiO2) that may be used as the insulating film 13 and, silicon (Si) that may be used as the base 11.

The electrolytic hydrophobic film 14 is preferably a relatively thin film, for example, about a few nanometers or less (for example 1 nm or more to 10 nm or less). Forming the electrolytic hydrophobic film 14 as a relatively thin film about a few nanometers or less facilitates local removal and achieves higher accuracy.

In the first embodiment, then, the electrolytic hydrophobic film 14 is formed with a monomolecular layer (self-assembled monolayer (SAM)). Since the SAM is a relatively thin film and its film thickness is easily controlled, the electrolytic hydrophobic film 14 is formed as a SAM, whereby the electrolytic hydrophobic film 14 relatively tale end uniform in film thickness can be easily formed on at least the upper end surface of the protruding structure including the protrusion 12a, the insulating from 13, and the edge electrode 15.

It is not essential that the electrolytic hydrophobic film 14 is a SAM structure. For example, the electrolytic hydrophobic film 14 may be a monolayer that is not a monomolecular layer or may be a multilayered structure including two or more layers each of which can be electrolyzed. When the electrolytic hydrophobic film 14 is a multilayered structure, at least the top layer preferably has hydrophobicity.

The electrolytic hydrophobic film may be formed on the pattern transfer surface of the transfer substrate. The electrolytic hydrophobic film may be formed on either or both of the edge electrode mold 10 side and the transfer substrate side as appropriate, depending on the required pattern precision, the restrictions in production process, and the like.

Figure 16:
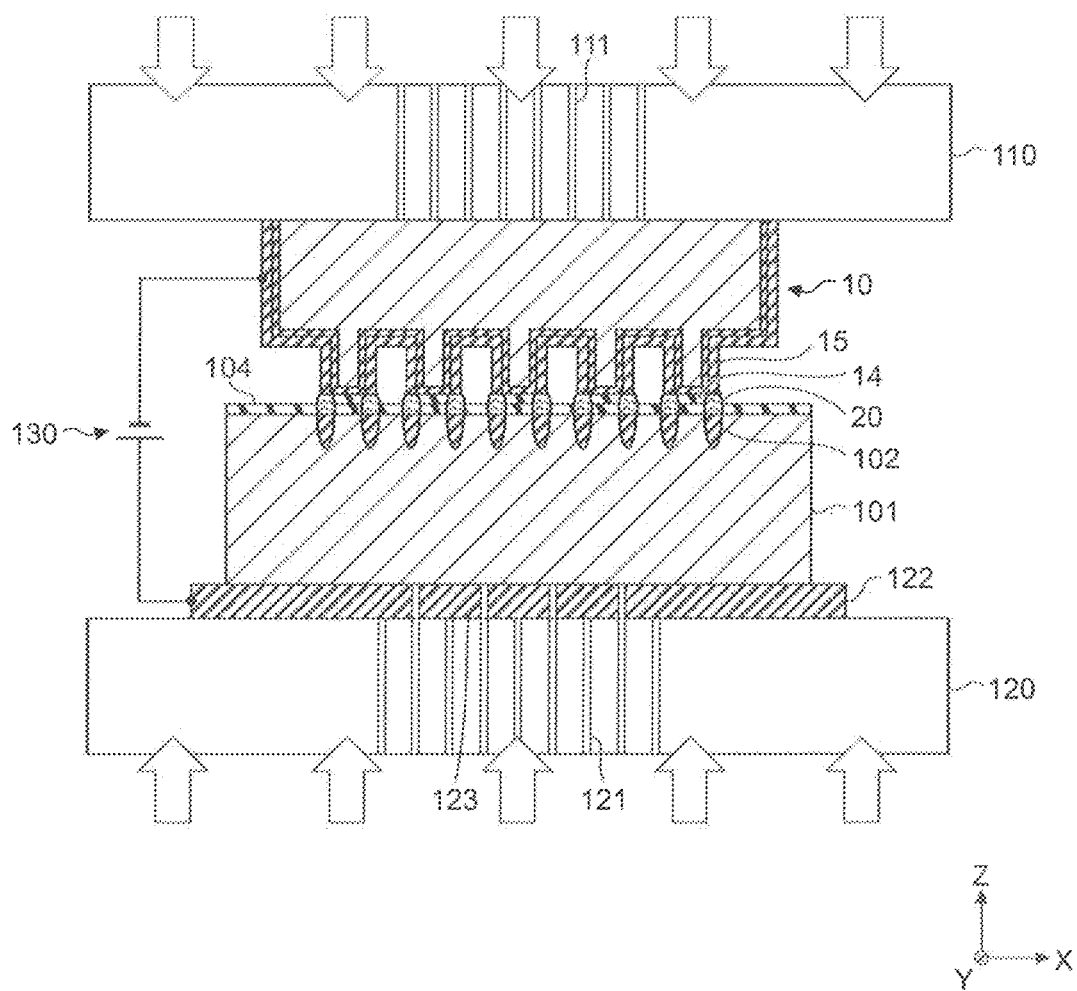
FIG. 16 is a schematic diagram for explaining pattern transfer operation using the edge electrode mold according to the first embodiment.
Figure 17:
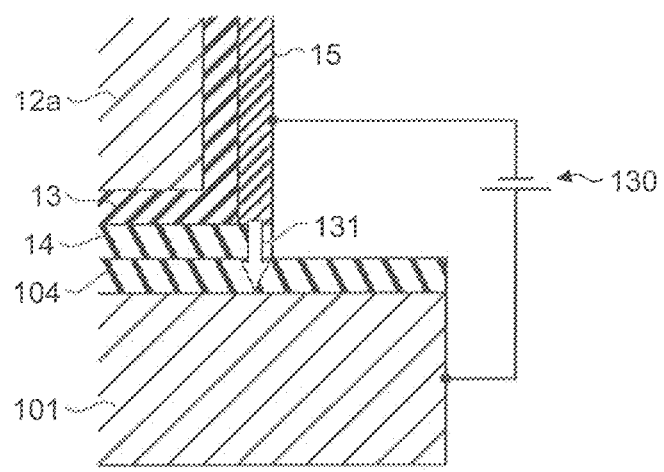
FIG. 17 is a first schematic diagram for explaining each step in the pattern transfer operation according to the first embodiment.

The pattern transfer operation using the edge electrode mold 10 according to the first embodiment will now be described in detail below with reference to the drawings. FIG. 16 is a schematic diagram for explaining the pattern transfer operation using the edge electrode mold according to the first embodiment. FIG. 17 to FIG. 20 are schematic diagrams for explaining each step in the pattern transfer operation according to the first embodiment. In the following description, the electrolytic hydrophobic film is formed both on the edge electrode mold 10 side and on the transfer substrate side, by way of example.

As illustrated in FIG. 16, during pattern transfer, a transfer substrate (for example, semiconductor substrate) 101 serving as a target is installed on a substrate holder (first holder) 120. A conductive substrate 122 is provided on the substrate holder 120. The transfer substrate 101 is placed on the conductive substrate 122 with the pattern transfer surface (the surface onto which a pattern is transferred), having the electrolytic hydrophobic film 104 formed thereon, facing up. The electrolytic hydrophobic film 104 provided on the transfer substrate 101 may be a film formed with the same material and film thickness as the electrolytic hydrophobic film 14 formed on the edge electrode mold 10 side.

The substrate holder 120 has a plurality of holes 121 for suction, and the conductive substrate 122 is sucked through the holes 121 to be fixed to the substrate holder 120. The conductive substrate 122 also has a hole 123 communicatively connected, with at least one of the holes 121 of the substrate holder 120. The transfer substrate 101 is sucked through the holes 121 of the substrate holder 120 to be fixed to the conductive substrate 122. As a result, the transfer substrate 101 is fixed to the substrate holder 120.

On the other hand, the edge electrode mold 10 is held by a mold holder (second holder) 110 such that the first main surface 11a having a plurality of protruding structures 12 is opposed to the pattern transfer surface of the transfer substrate 101. The mold holder 110 has, for example, a plurality of holes 111 for suction, and the edge electrode mold 10 is sucked through, the holes 111 to be fixed to the mold holder 110.

At least one of the mold holder 110 and the substrate holder 120 is movable in the Z direction by a not-illustrated moving mechanism. At least one of the mold holder 110 and the substrate holder 120 is moved in the a direction whereby the protruding structures 12 of the edge electrode mold 10 are biased in contact with or in proximity to the pattern transfer surface of the transfer substrate 101.

Figure 18:
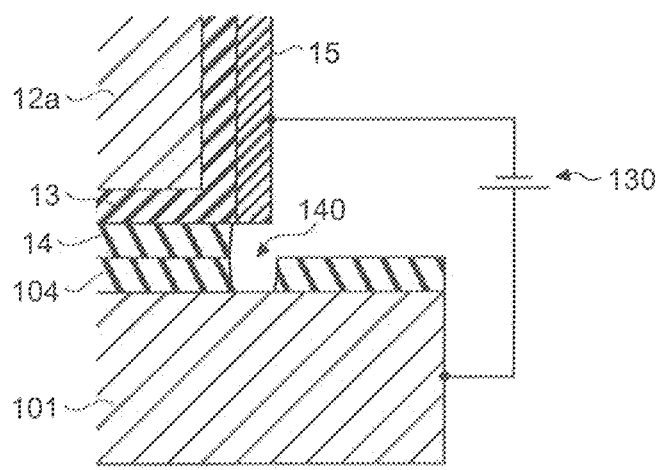
FIG. 18 is a second schematic diagram for explaining each step in the pattern transfer operation according to the first embodiment.

The negative electrode of a power supply 130 is connected to the extraction electrode 16 of the edge electrode mold 10 held on the mold holder 110. The positive electrode of the power supply 130 is connected to the conductive substrate 122. During pattern transfer, a potential difference (bias voltage) is applied between the edge electrode mold 10 and the transfer substrate 101 by the power supply 130 in a state in which the protruding structures 12 of the edge electrode mold 10 and the pattern transfer surface of the transfer substrate 101 are in contact with or in proximity to each other. As illustrated by the arrow 131 in FIG. 17, local bias voltage is then applied between the edge electrode 15 of the edge electrode mold 10 and the transfer substrate 101, and then the electrolytic hydrophobic films 14 and 104 under the edge electrode 15 are electrolyzed and removed. As a result, as illustrated in FIG. 18, the upper surface of the edge electrode 15 is exposed, and a gap 140 is formed to locally expose the pattern transfer surface of the transfer substrate 101.

Figure 19:
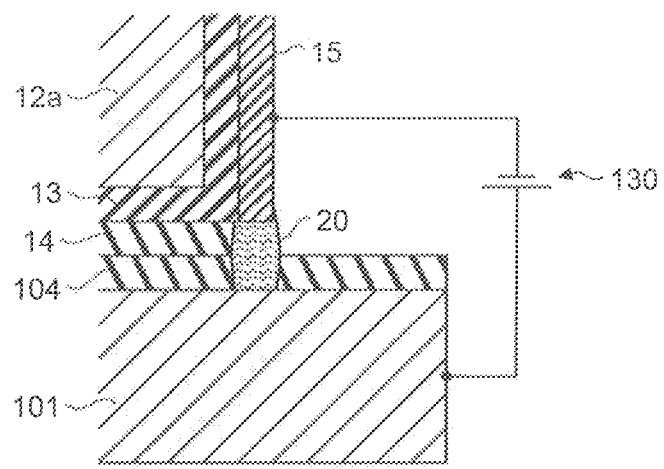
FIG. 19 is a third schematic diagram for explaining each step in the pattern transfer operation according to the first embodiment.
Figure 20:
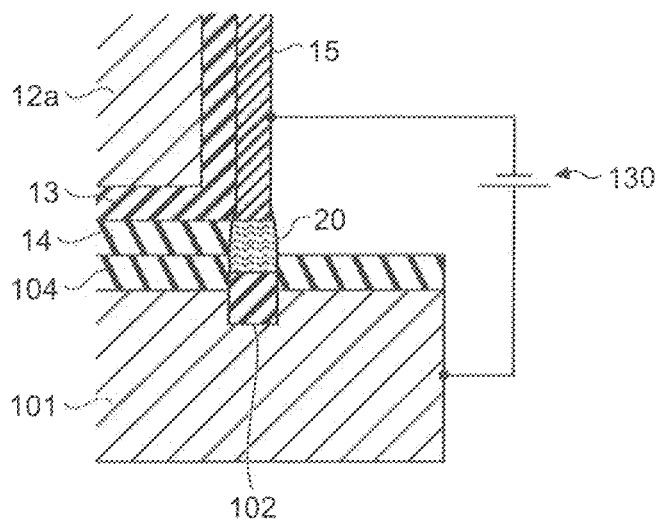
FIG. 20 is a fourth schematic diagram, for explaining each step in the pattern transfer operation according to the first embodiment.

Water molecules in the atmosphere gas aggregate to form a meniscus 20 in the gap formed in the electrolytic hydrophobic films 14 and 104, as illustrated in FIG. 19. A potential difference (bias voltage) is then applied between the edge electrode mold 10 and the transfer substrate 101 in the same manner as when the gap 140 is formed. This allows electrons to be injected from the edge electrode 15 into the exposed region in the pattern transfer surface of the transfer substrate 101. As a result, this region (hereinafter referred to as electron injection region) 102 acquires the property different from the property of the other region where electrons are not injected, as illustrated in FIG. 20.

For example, when a silicon substrate is used for the transfer substrate 101, silicon atoms (Si) in the electron injection region 102 react with water molecules (H2O) in the meniscus 20 to be oxidized during injection of electrons, thereby to form silicon oxide (SiOx) in the electron injection region 102. As a result, a silicon oxide film (electron injection region 102) having the same layout as the pattern portion formed with the upper end surface of the edge electrode 15 is formed on the pattern transfer surface of the transfer substrate 101. Silicon and silicon oxide differ in etching resistance. That is, in the present example, etching resistance is illustrated as an example or the property changed through electron injection. The property to be changed is not limited to etching resistance. That is, the properties to be changed such as chemical properties and physical properties (for example, shape) may be selected as appropriate depending on the purpose.

In a method of manufacturing a semiconductor device, including the aforementioned pattern transfer operation, the electron injection region 102 with the property changed in the step illustrated in FIG. 16 can be used as a mask in the steps such as etching and ion implantation. For example, when a silicon substrate is used for the transfer substrate 101, the silicon oxide film formed in the step illustrated in FIG. 16 stay be used as a mask to etch the transfer substrate 101, or this silicon oxide film may be used as a mask to implant ions into the transfer substrate 101. Alternatively, the electron injection region 102 with the property changed through transfer per se may serve as a component of a semiconductor device structure.

The mechanism by which the electrolytic hydrophobic film 14/104 is removed by application of bias voltage will now be described in detail with reference to the drawings. In the following description, hexamethyldisilazane (HMDS) is used as a material of the electrolytic hydrophobic film 14/104, and its layer structure is SAM, by way of illustration. In this example, the material of the base 11 and the protrusions 12a of the edge electrode mold 10 is silicon, and the material of the insulating film 13 is silicon oxide.

Figure 21:
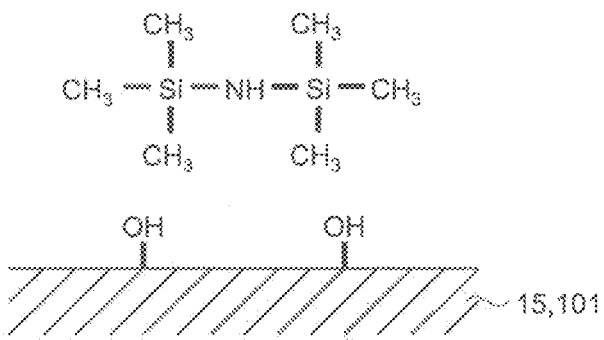
FIG. 21 is a first diagram for explaining the mechanism by which an electrolytic hydrophobic film is removed by application of bias voltage.

FIG. 21 to FIG. 24 are diagrams for explaining the mechanism by which the electrolytic hydrophobic film is removed by application of bias voltage. First, as illustrated in FIG. 21, for example, a reaction with water molecules in the atmosphere gas forms hydroxyl group (—OH) on the edge electrode 15 surface/the transfer substrate 101 surface on which the electrolytic hydrophobic film 14/104 as to be formed. In this state, the edge electrode 15 surface/the transfer substrate 101 surface has hydroprilicity.

Figure 22:
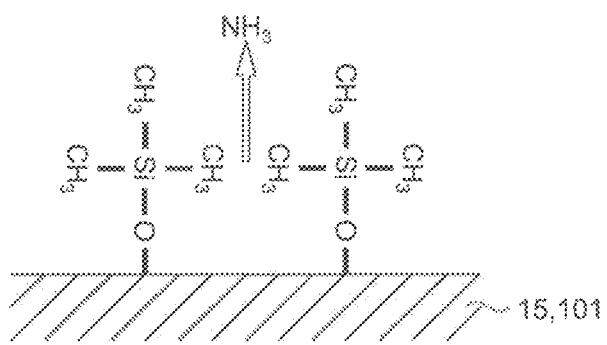
FIG. 22 is a second diagram for explaining the mechanism by which the electrolytic hydrophobic film is removed by application of bias voltage.

Hexamethyldisilazane ((CH3)3Si—NH—Si (CH3)3) is introduced, for example, through a simple vapor deposition process on the edge electrode 15 surface/the transfer substrate 101 surface having hydroxyl group (—OH). Then, as illustrated in FIG. 22, hexamethyldisilazane reacts with the hydroxyl group (—OH) to allow the edge electrode 15 surface/the transfer substrate 101 surface to be covered with the SAM of hexamethyldisilazane. In this state, since the edge electrode 15 surface/the transfer substrate 101 surface is covered with methyl group (—CH3) having hydrophobicity, the edge electrode 15 surface/the transfer substrate 101 surface has hydrophobicity.

Figure 23:
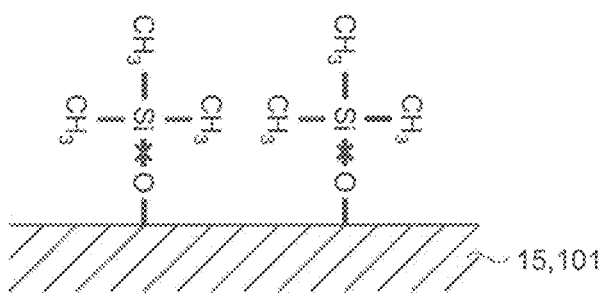
FIG. 23 is a third diagram for explaining the mechanism by which the electrolytic hydrophobic film is removed by application of bias voltage.
Figure 24:
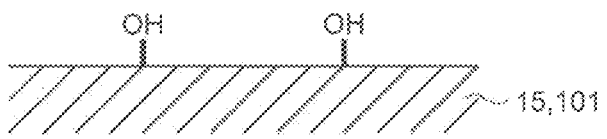
FIG. 24 a is a fourth diagram for explaining the mechanism by which the electrolytic hydrophobic film is removed by application of bias voltage.

When bias voltage is applied to the edge electrode 15 surface/the transfer substrate 101 surface covered with methyl group (—CH3), a high electric field cuts off the methyl group (—CH3) to cause destruction of the SAM on the edge electrode 15 surface/the transfer substrate 101 surface, as illustrated in FIG. 23. On the edge electrode 15 surface/the transfer substrate 101 surface exposed due to the destruction of the SAM, hydroxyl group (—OH) is formed again to impart hydrophilicity, as illustrated in FIG. 24. As a result, a meniscus is formed on the exposed edge electrode 15 surface/transfer substrate 15/101 surface.

In the edge electrode 15 surface/the transfer substrate 101 surface, a region where the SAM of hexamethyldisilazane is not removed remains hydrophobic. Formation of a meniscus is therefore suppressed in the region where the SAM of hexamethyldisilazane is not removed.

As described above, formation of a meniscus is permitted in the region where the SAM of hexamethyldisilazane is removed, and formation of a meniscus is suppressed in the region where the SAM of hexamethyldisilazane is not removed. This configuration can control the presence range of the meniscus formed between the edge electrode mold 10 and the transfer substrate 101. Controlling the presence range of the meniscus in this way can suppress degradation of the transfer resolution dependent on the size of the meniscus as well as increase in roughness of the transfer pattern. In addition, for this reason, the bias voltage application time during pattern transfer can be increased, which enables formation of a more uniform transfer pattern.

A method of producing the edge electrode mold 10 according to the first embodiment will now be described in detail with reference to the drawings. FIG. 25 to FIG. 30 are process diagrams illustrating the method of producing an edge electrode mold according to the first embodiment. In the present description, a p-type silicon (100) substrate with a resistivity of about 5 to 10 Ω·cm, a diameter of about four inches, and a thickness of 525±25 μm is used.

Figure 25:
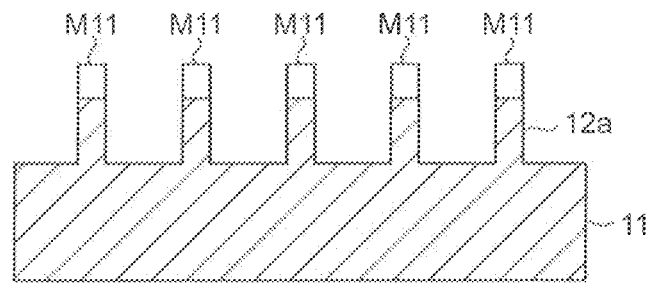
FIG. 25 is a first process diagram illustrating a method of producing an edge electrode mold according to the first embodiment.

In the present production method, first, a resist M11 having a predetermined pattern is formed on a silicon substrate. Subsequently, using the resist M11 as a mask, the surface having the resist M11 is engraved, for example, by 2 μm to process the silicon substrate into the protrusions 12a and the base 11, as illustrated in FIG. 25. The resist M11 can be formed, for example, by electron beam (EB) lithography. The silicon substrate can be engraved using an inductive coupled plasma-reactive ion etching (ICP-RIE) system.

Figure 26:
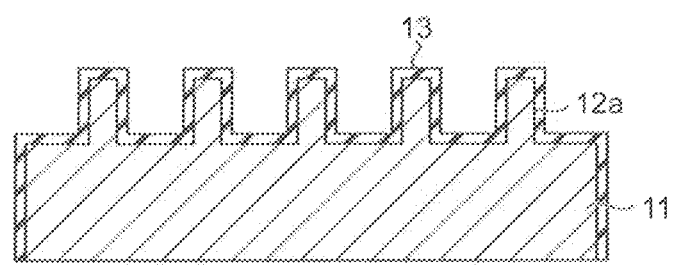
FIG. 26 is a second process diagram illustrating the method of producing an edge electrode mold according to the first embodiment.

Subsequently, after the resist M11 is removed, the base 11 having the protrusions 12a thereon undergoes a thermal oxidation process such as annealing to form the insulating film 13, for example, of about 160 nm on the surfaces of the protrusions 12a and the base 11, as illustrated in FIG. 26.

Figure 27:
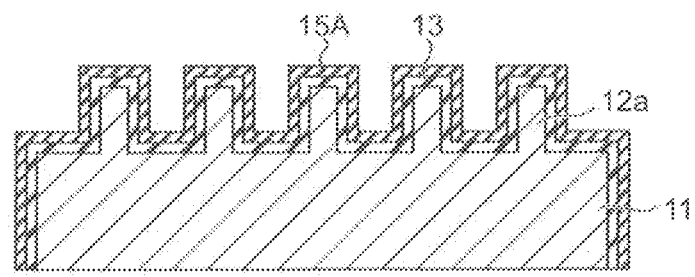
FIG. 27 is a third process diagram illustrating the method of producing an edge electrode mold according to the first embodiment.

Subsequently, for example, the electron beam (EB) evaporation process is used to form, for example, a 40 nm-thick ruthenium (Ru) film 15A on the insulating film 13 that covers the protrusions 12a and the base 11, as illustrated in FIG. 27.

Figure 28:
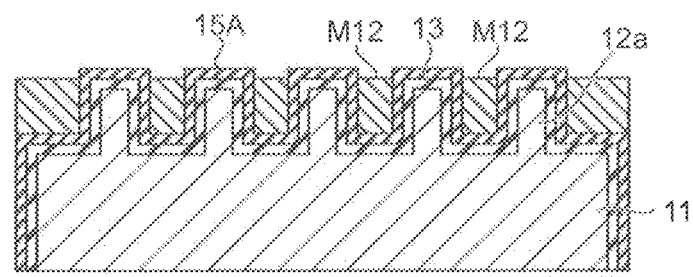
FIG. 28 is a fourth process diagram illustrating the method of producing an edge electrode mold according to the first embodiment.

Subsequently, a resist coating step and an etch back step are performed to form a resist M12 exposing at least the upper end surfaces of the protrusions in the depressed portion of the concave/convex shape including the protrusions 12a, the insulating film 13, and the Ru film 15A formed on the upper surface of the base 11, as illustrated in FIG. 28.

Figure 29:
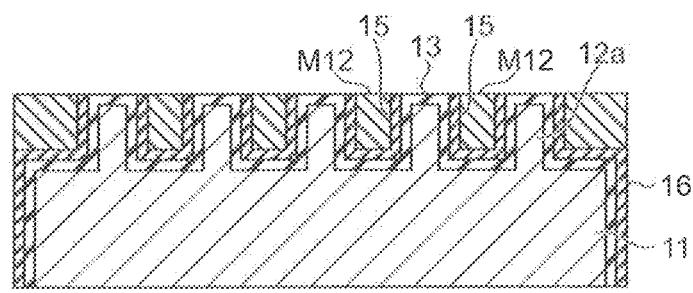
FIG. 29 is a fifth process diagram illustrating the method of producing an edge electrode mold according to the first embodiment.

Subsequently, as illustrated in FIG. 29, the Ru film 15A exposed from the resist M12 is removed, for example, through an ion milling step to process the Ru film 15A into the edge electrodes 15 and the extraction electrode 16.

Figure 30:
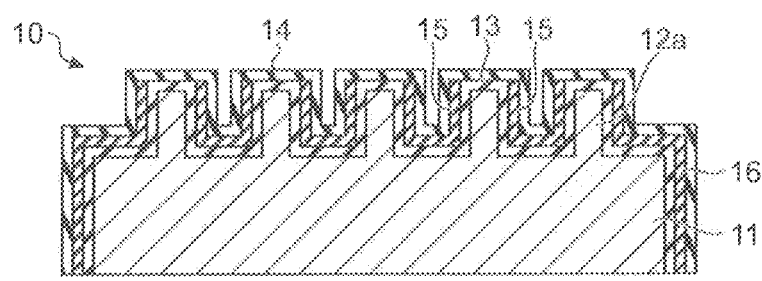
FIG. 30 is a sixth, process diagram illustrating the method of producing an edge electrode mold according to the first embodiment.

Subsequently, after the resist M12 is removed, hexamethyldisilazane (HMDS) is applied to the surface having the protruding structures in the base 11 to form the edge electrode mold 10 covered with the electrolytic hydrophobic film 14 of SAM at least on the upper end surfaces of the protruding structures, as illustrated in FIG. 30. Hexamethyldisilazane (HMDS) may be applied, for example, using a simple vapor deposition process.

Figure 31:
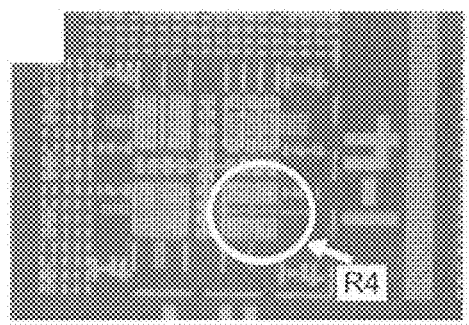
FIG. 31 is a top view illustrating an example of the edge electrode mold fabricated by the production method according to the first embodiment.
Figure 32:
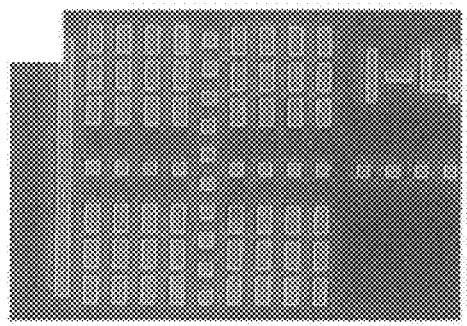
FIG. 32 is a partially enlarged view of FIG. 31.
Figure 33:
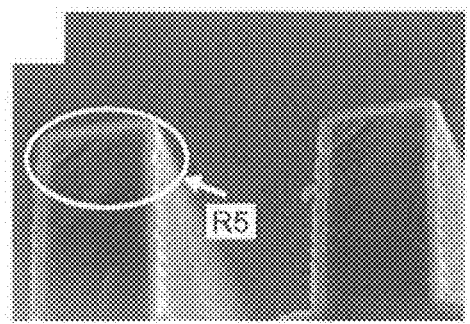
FIG. 33 is a cross-sectional view illustrating an example of the protruding structure in the edge electrode mold fabricated by the production method according to the first embodiment.
Figure 34:
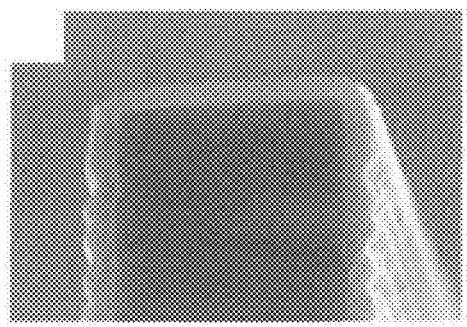
FIG. 34 is a partially enlarged view of FIG. 33.

FIG. 31 to FIG. 34 illustrate an example of the edge electrode mold fabricated through the production method according to the first embodiment described above. FIG. 31 is a top view illustrating an example of the edge electrode mold fabricated through the production method according to the first embodiment, and FIG. 32 is an enlarged view of a region R4 in FIG. 31. FIG. 33 is a cross-sectional view illustrating an example of the protruding structure in the edge electrode mold fabricated through the production method according to the first embodiment, and FIG. 34 is an enlarged view of a region R5 in FIG. 33. In the edge electrode mold (10) illustrated in FIG. 31 and FIG. 32, the area size of the protruding structure (12) is about 4 mm square, the half pitch of the protruding structures (12) is about 4 μm, and the area of the protruding structure (12) is about 4.45 mm².

As illustrated in FIG. 31 and FIG. 32, the use of the production method according to the first embodiment enables fabrication of the edge electrode mold having a fine pattern with high accuracy. As illustrated in FIG. 33 and FIG. 34, it is found that the production method according to the first embodiment forms a favorable layer structure even at the protruding structure in the produced edge electrode mold.

Figure 35:
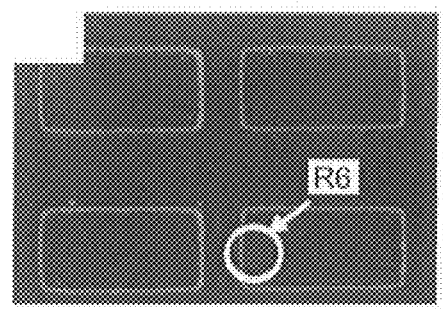
FIG. 35 is a view illustrating a pattern transfer result in a case when the electrolytic hydrophobic film according to the first embodiment is not introduced.
Figure 36:
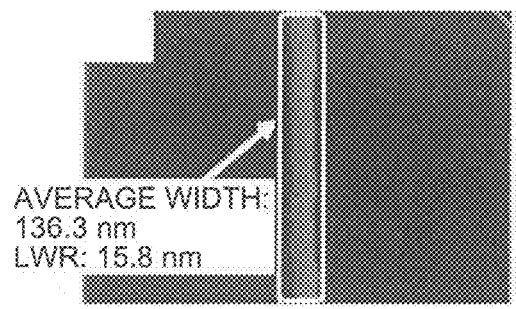
FIG. 36 is a partially enlarged view of FIG. 35.
Figure 37:
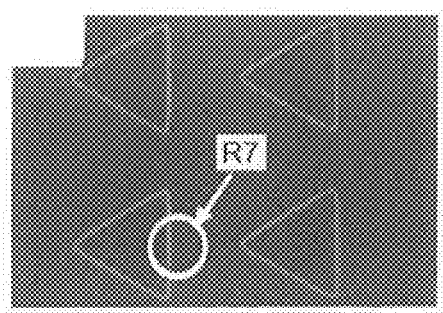
FIG. 37 is a view illustrating a pattern transfer result in a case when the electrolytic hydrophobic film according to the first embodiment is introduced.
Figure 38:
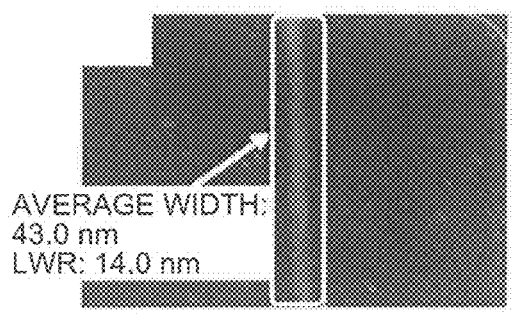
FIG. 38 is a partially enlarged view of FIG. 37.

FIG. 35 to FIG. 38 illustrate the result of verification of the meniscus-controlling effect achieved by the electrolytic hydrophobic film (14/104) according to the first embodiment. FIG. 35 is a view illustrating the pattern transfer result in a case when the electrolytic hydrophobic film according to the first embodiment is not introduced, and FIG. 36 is an enlarged view of a region R6 in FIG. 35. FIG. 37 is a view illustrating the pattern transfer result in a case when the electrolytic hydrophobic film according to the first embodiment is introduced, and FIG. 38 is an enlarged view of a region R7 in FIG. 37.

In the verification illustrated in FIG. 35 to FIG. 38 the bias voltage during pattern transfer was 17 volts (V), the bias voltage had a frequency of 1 hertz (Hz) with a duty ratio of 50%, the relative humidity was 80%, the substrate temperature of the transfer substrate 101 was 10.1° C, the process time was one minute, and the pressure for biasing the edge electrode mold 10 toward the transfer substrate 101 was 100 newton (N).

As can be understood from the comparison of FIG. 35 and FIG. 36 with FIG. 37 and FIG. 38, when the electrolytic hydrophobic film (14/104) according to the first embodiment is introduced (FIG. 37 and FIG. 38), the transfer resolution is improved from about 140 nm to about 40 nm, compared with when the electrolytic hydrophobic film is not introduced (FIG. 35 and FIG. 36). This indicates that the introduction of the electrolytic hydrophobic film (14/104) according to the first embodiment suppresses expansion of the meniscus. The comparison of FIG. 35 and FIG. 36 with FIG. 37 and FIG. 38 also indicates that the ratio of line width roughness (LWR) to the line width (LW) of the transfer pattern is reduced to above 10% because of the structure in which the insulating film 13 is interposed between the electrolytic hydrophobic film 14 and the base 11 and between the electrolytic hydrophobic film 14 and the protrusions 12a to prevent direct contact of the electrolytic hydrophobic film 14 with the base 11 or the protrusions 12a.

As explained above, in the first embodiment, the edge electrode mold 10 having the edge electrode 15 for pattern transfer formed on the side surface of the protruding structure 12 is used to transfer a pattern. This configuration enables pattern transfer with low cost and with high resolution.

The electrolytic hydrophobic film 14 and/or 104 interposed between the edge electrode 15 and the transfer substrate 101 enables control of the expansion of the meniscus 20 during pattern transfer, thereby reducing the length of contact between the meniscus 20 and the transfer substrate 101. As a result, a pattern can be precisely transferred without reduction of the transfer resolution.

Furthermore, since the edge electrode mold 10 having an oxide film serving as the insulating film 13 has high compatibility with the steps such as electron beam lithography, high size-precision and low pattern-roughness can be achieved when the edge electrode mold 10 is fabricated.

Figure 39:
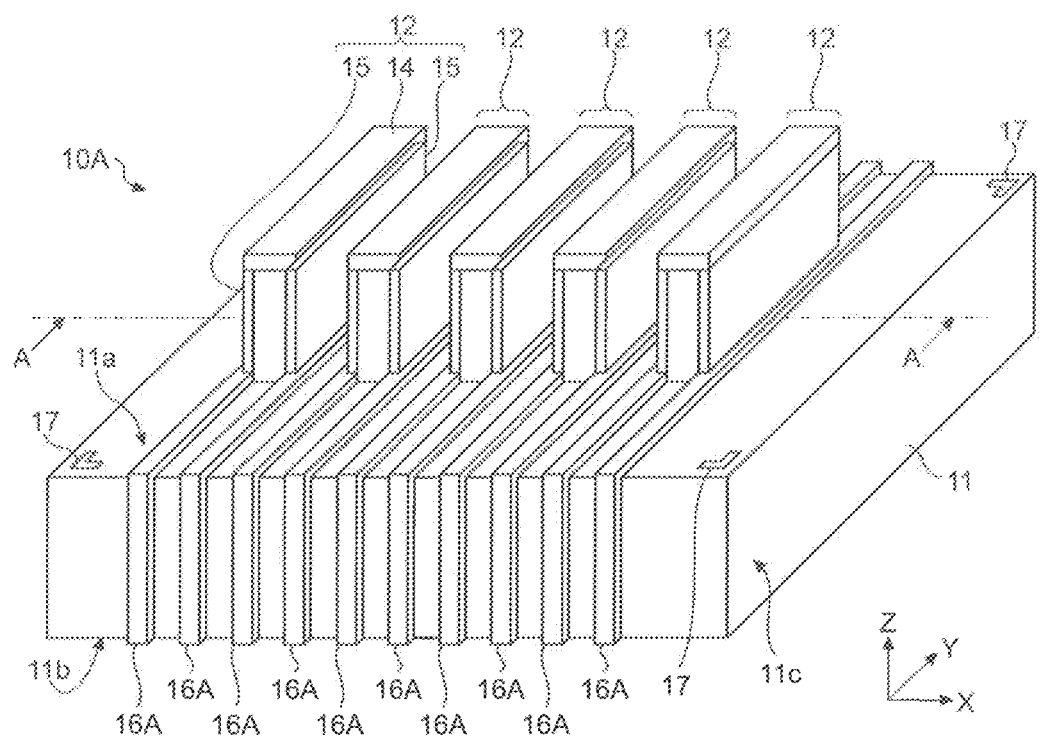
FIG. 39 is a perspective view illustrating a schematic configuration example eft a modification to the edge electrode mold according to the first embodiment.

The extraction electrode 16 for a plurality of edge electrodes 15 may be replaced by a plurality of extraction electrodes 16A individually provided for the edge electrodes 15, as in an edge electrode mold 10A illustrated in FIG. 39. In this case, the power supply 130 illustrated in FIG. 16 may be independently connected to each of a plurality of extraction electrodes 16A or may be connected in common. Alternatively, the extraction electrodes 16A may be divided into two or more groups, and the power supply 130 may be provided individually for each of the groups. Alternatively, a plurality of edge electrodes 15 may be divided info two or more groups, and the extraction electrode 16A may he provided individually for each of the groups.

In the contact-type thin-film edge electrode lithography illustrated above, the contact state between the protruding structures 12 of the edge electrode mold 10 and the transfer substrate 101 may have a significant effect on the transfer characteristics. For this, to achieve uniform pattern transfer, it is important to bring the upper end surfaces of the edge electrodes 15 into contact with the transfer substrate 101 uniformly. In the non-contact-type thin-film edge electrode lithography, to achieve uniform pattern transfer, it is important to keep constant the distance between the upper end surfaces of the edge electrodes 15 and the transfer substrate 101.

Here, when the mold and the transfer substrate each have a rigid structure, there arises a need for applying a relatively large pressure between the mold and the transfer substrate in order to make the contact therebetween uniform. The rigid stricture means that the amount of deformation against stress is relatively small. However, because of the relatively fragile structure of the protrusion of the mold, applying a large pressure between the mold and the transfer substrate may destroy the pattern portion provided at the protrusions of the mold and cause transfer failure.

By contrast, the electrolytic hydrophobic film (14/104) according to the first embodiment is likely to be formed with a material with a low hardness (or low rigidity or high flexibility) compared with the protrusions 12a and the insulating film 13. In this case, the electrolytic hydrophobic film (14/104) may also function as a cushion when the edge electrode mold 10 is biased toward the transfer substrate 101, whereby the edge electrode 15 can be brought into contact with the pattern transfer surface of the transfer substrate 101 uniformly without destruction of the protruding structures 12. As a result, it can be expected that the contact uniformity between the protruding structures 12 of the edge electrode mold 10 and the transfer substrate 101 is improved.

Second Embodiment

A mold, a method of producing a mold, a production apparatus, and a method of manufacturing a semiconductor device according to a second embodiment will now be described in detail with reference to the drawings. In the following description, the similar configuration as in the first embodiment is denoted with the same reference signs, and an overlapping description thereof will be omitted.

Figure 40:
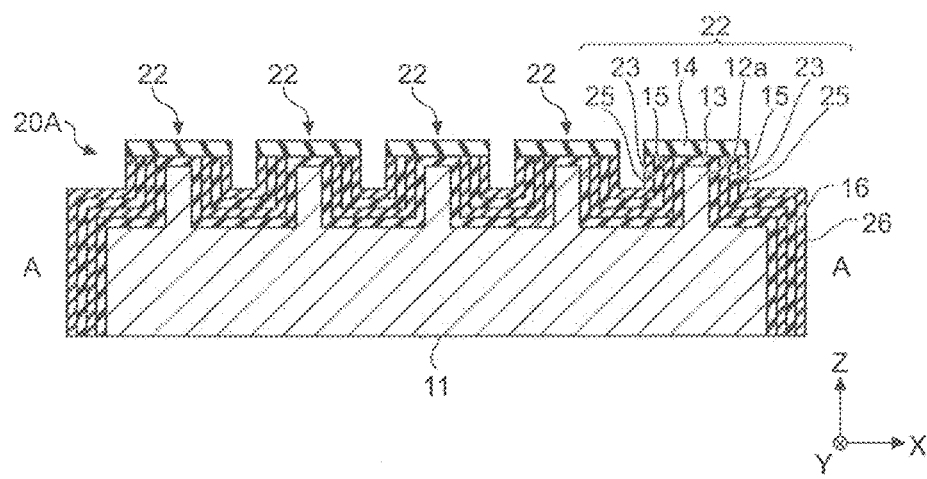
FIG. 40 is a cross-sectional view illustrating a schematic configuration example of the edge electrode mold according to a second embodiment.

FIG. 40 is a cross-sectional view illustrating a schematic configuration example of the edge electrode mold according to the second embodiment. FIG. 40 illustrates a configuration example of the cross section corresponding to FIG. 15 in the first embodiment. As illustrated in FIG. 40, an edge electrode mold 20A has a similar configuration as the edge electrode mold 10 according to the first embodiment, except that it further includes a layered structure including an insulating film 23 and an edge electrode (second electrode) 25 on the outside of the layered structure including the insulating film 13 and the edge electrode 15 formed on the protrusion 12a. The edge electrode 25 is connected to an extraction electrode 26, in the same manner as the edge electrode 15.

The edge electrode 25 and the extraction electrode 26 each may be formed of a conductive material similar to that of the edge electrode 15 and the extraction electrode 16. When the edge electrode 15 is electrically connected to the extraction electrode 26, the extraction electrode 16 may be omitted.

When two or more edge electrodes are provided on one side of the protruding structure 22 in this manner, a finer pitch of the pattern can be achieved. For example, when two edge electrodes are provided on one side of the protruding structure 22, a fine pattern with a pitch that is one quarter of the pitch of the protrusions 12a can be achieved.

Furthermore, the structure in which no protrusion 12a is interposed between a plurality of edge electrodes 15 and 25 also enables formation of a finer pitch pattern without being limited by the resolution of lithography in forming the protrusions 12a from the substrate from which the base 11 is formed.

The other configuration, production method, and effects are similar to those in the first embodiment and will not be further elaborated here. In the method of producing the edge electrode mold 20A, after the insulating film 13 and a conductive film (illustrated as the Ru film 15A in the first embodiment) are deposited (FIG. 26 to FIG. 27), an oxide film and a conductive film (for example, Ru film) may be successively deposited, in a similar process as in the production method explained with reference to FIG. 25 to FIG. 30 in the first embodiment. The conductive film, the oxide film, and the conductive film (Ru film 15A) on the upper end surfaces of the protruding structures may be successively etched back, for example, through the steps similar to the steps explained with reference to FIG. 28 to FIG. 29. The electrolytic hydrophobic film 14 may be applied, for example, through a similar step as the step explained with reference to FIG. 30.

Although the foregoing embodiments are premised on thin-film edge electrode lithography, the embodiments are applicable to any other nanoimprint lithography. For example, in a mold having an electrode formed on the upper end surface of the protruding structure including the protrusion 12a and the insulating film 13, an electrolytic hydrophobic film may be formed to cover the electrode.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A mold comprising:
a base having s first main surface; and
one or more protruding structure disposed on the first main surface,
the protruding structures comprising;
a protrusion projecting from the first main surface of the base,
a first electrode disposed at the protrusion, and
an electrolytic hydrophobic film disposed on an upper surface of a protruding shape including the protrusion and the first electrode, the electrolytic hydrophobic film having electrolytic property and hydrophobicity.

2. The mold according to claim 1, wherein the electrolytic hydrophobic film is formed of a material having hydrophobicity higher than a material that forms the protrusion.

3. The mold according to claim 1, wherein the electrolytic hydrophobic film is a monomolecular layer.

4. The mold according to claim 1, wherein the electrolytic hydrophobic film has a film thickness of not less than 1 nm and not more than 10 nm.

5. The mold according to claim 1, wherein the electrolytic hydrophobic film includes organic silane.

6. The mold according to claim 1, wherein the electrolytic hydrophobic film includes hexamethyldisilazane.

7. The mold according to claim 1, wherein the electrolytic hydrophobic film has a hardness lower than a hardness of the protrusion.

8. The mold according to claim 1, wherein the first electrode is disposed on each of at least two of side surfaces of the protrusion.

9. The mold according to claim 1, wherein the protruding structures further comprise an insulating film interposed between the protrusion and the first electrode.

10. The mold according to claim 1, wherein the protruding structures further comprise an insulating film disposed on an upper end surface of the protrusion.

11. The mold according to claim 10, wherein the electrolytic hydrophobic film is formed of a material having hydrophobicity higher than a material that forms the insulating film.

12. The mold according to claim 1, wherein
the protruding structures further comprises:
- an insulating film disposed on a second side surface of the first electrode, the second side surface being opposite to a first side surface opposed to the protrusion, and
- a second electrode disposed on a fourth side surface of the insulating film, the fourth side surface being opposite to a third side surface in contact with the first electrode, and the electrolytic hydrophobic film is disposed on an upper end surface of the protruding shape including the insulating film and the second electrode in addition to the protrusion and the first electrode.

13. A production apparatus comprising;
the mold according to claim 1;
a substrate holder configured to bold a transfer target;
a mold holder configured to hold the mold such that the first main surface is opposed to a pattern transfer surface of the transfer target placed on the substrate holder; and
a power supply configured to apply a potential difference between the transfer target and the mold.

* * * * *